United States Patent [19]

Gidden

[11] Patent Number: 4,516,213
[45] Date of Patent: May 7, 1985

[54] MULTIPLE RATE METERING SYSTEM

[75] Inventor: Robert A. Gidden, Brampton, Canada

[73] Assignee: E. Grant Deans, Toronto, Canada

[21] Appl. No.: 344,500

[22] Filed: Feb. 1, 1982

[51] Int. Cl.³ ............................................. G01R 21/00
[52] U.S. Cl. ................................ 364/483; 324/103 R;
324/113; 324/114; 324/137; 340/870.02;
346/33 R; 346/14 MR; 364/464
[58] Field of Search ............ 364/483, 464; 346/33 R,
346/14 MR; 340/870.02; 324/103 R, 113–116,
137

[56] References Cited
U.S. PATENT DOCUMENTS 3,046,534  7/1962  Constant, Jr. ................. 340/870.02
3,422,441  1/1969  Chapsky ......................... 346/14 MR
4,119,948 10/1978  Ward et al. .................... 340/870.02
4,132,981  1/1979  White ............................ 340/870.02

Primary Examiner—Errol A. Krass
Assistant Examiner—Heather Herndon
Attorney, Agent, or Firm—Holman & Stern

[57] ABSTRACT

A multiple rate metering system suitable for use with an existing single rate, electromechanical electricity meter employing an Eddy current disc mounted in a casing, comprises a first unit mountable inside the casing of the electricity meter, and a second unit, which is portable so that it can be brought into close proximity with said first unit by a meter reader. The first unit comprises a sensor for generating pulses in response to rotation of the Eddy current disc, a first microprocessor, a first read-only-memory for storing a program to control the operation of said first microprocessor, a random-access-memory, the first microprocessor being programmed to store data in said random-access memory related to the pulse count in different predetermined periods during which different electricity rates apply, and a first coupling device for establishing communication through the casing with said second unit when said second unit is brought into proximity with said first unit. The second unit comprises a second coupling device co-operating with the first coupling device to transmit and receive data to and from the first unit, a second microprocessor, a second read-only-memory for storing a program controlling the operation of said second microprocessor, a storage medium for storing data from said second microprocessor, a display unit, a first actuator operable by the reader to transmit a signal through the first and second coupling devices to instruct the first microprocessor to transfer data relating to the pulse count in the different predetermined periods to the second unit. The second microprocessor is arranged to display the data in the display unit, and the operator can accept or reject the data and instruct the second microprocessor to store the data in the storage medium with appropriate customer identification for subsequent retrieval at a central location.

11 Claims, 10 Drawing Figures

FIG. 3

| | |
|---|---|
| 0 | R0 |
| 1 | R1 |
| 2 | R2 |
| 3 | R3 |
| 4 | R4 |
| 5 | R5 |
| 6 | R6 |
| 7 | R7 |
| 8 | |
| 9 | |
| 10 | |
| 11 | |
| 12 | |
| 13 | |
| 14 | |
| 15 | 8 LEVEL |
| 16 | STACK |
| 17 | |
| 18 | |
| 19 | |
| 20 | |
| 21 | |
| 22 | |
| 23 | |
| 24 | R0' |
| 25 | R1' |
| 26 | R2' |
| 27 | R3' |
| 28 | R4' |
| 29 | R5' |
| 30 | R6' |
| 31 | R7' |

| | |
|---|---|
| 32 | SECONDS |
| 33 | MINUTES |
| 34 | HOURS |
| 35 | DAY OF WEEK |
| 36 | |
| 37 | |
| 38 | YEAR |
| 39 | MONTH |
| 40 | DAY OF MONTH |
| 41 | |
| 42 | TOTAL ROTATIONS (P5) |
| 43 | |
| 44 | ROTATIONS |
| 45 | SAT. SUN. & HOLIDAYS |
| 46 | (P4) |
| 47 | ROTATIONS |
| 48 | 7-11AM MON.-FRI. |
| 49 | (P1) |
| 50 | ROTATIONS |
| 51 | 4-6 PM MON.-FRI. |
| 52 | (P2) |
| 53 | ROTATIONS |
| 54 | OTHER HRS. MON.-FRI. |
| 55 | (P3) |
| 56 | |
| 57 | LIMIT 1 (90 RPM) |
| 58 | |
| 59 | |
| 60 | LIMIT 2 (100 RPM) |
| 61 | |
| 62 | |
| 63 | ALARM STATUS  bit 0 = ALARM 1  bit 1 = ALARM 2 |

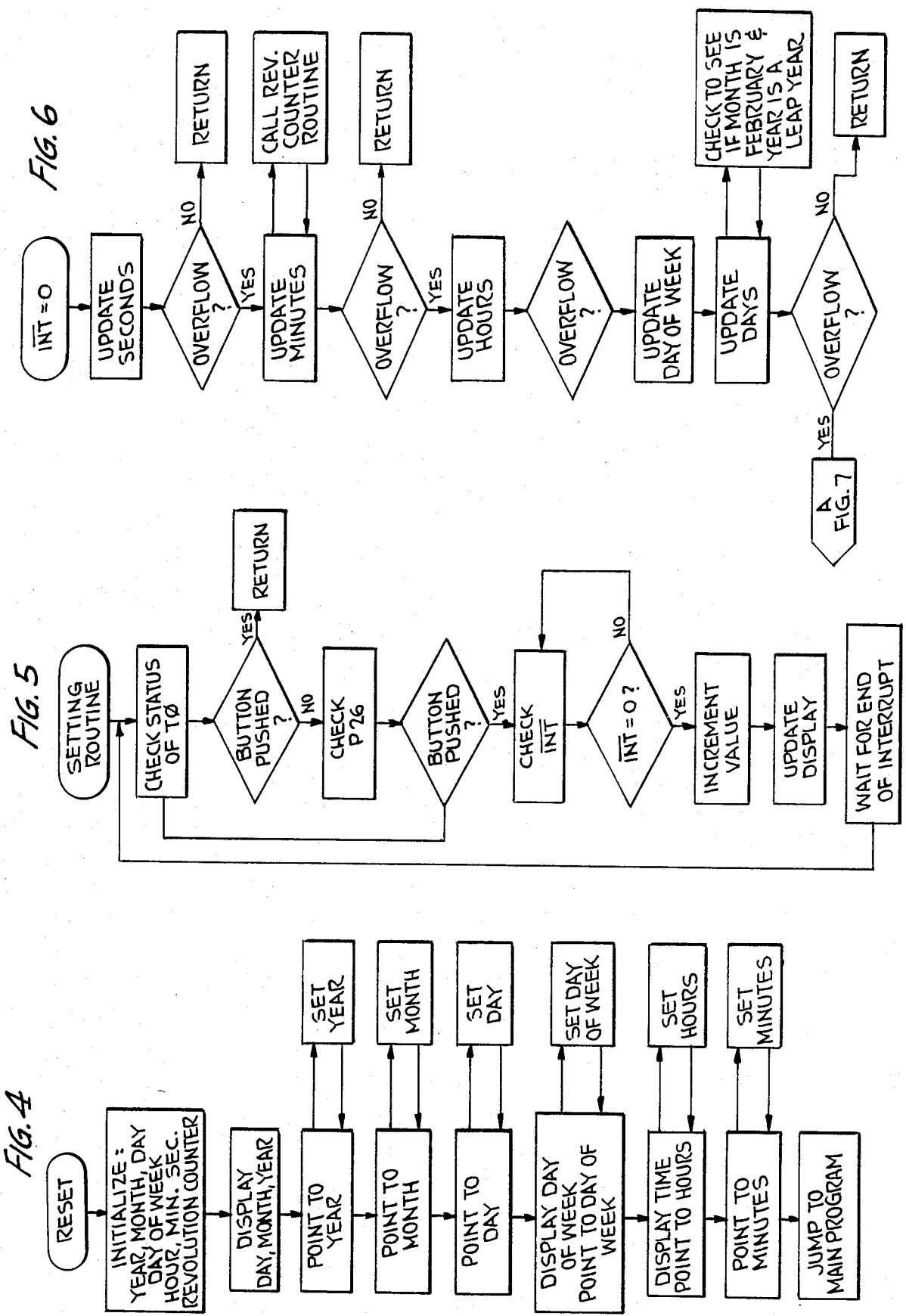

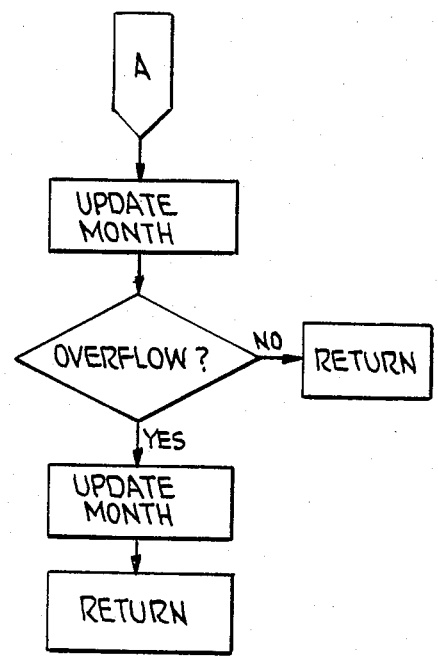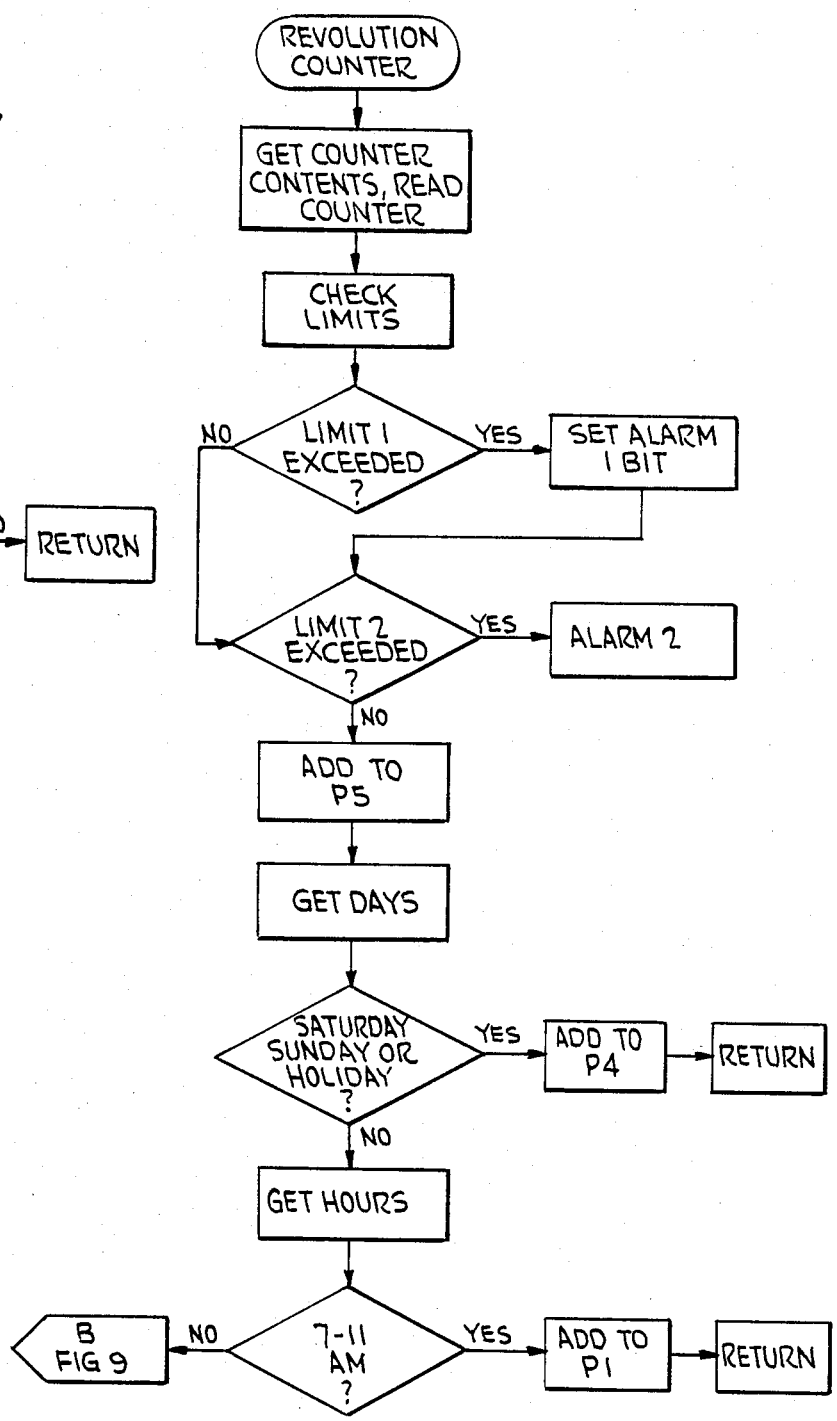
FIG. 7
FIG. 8

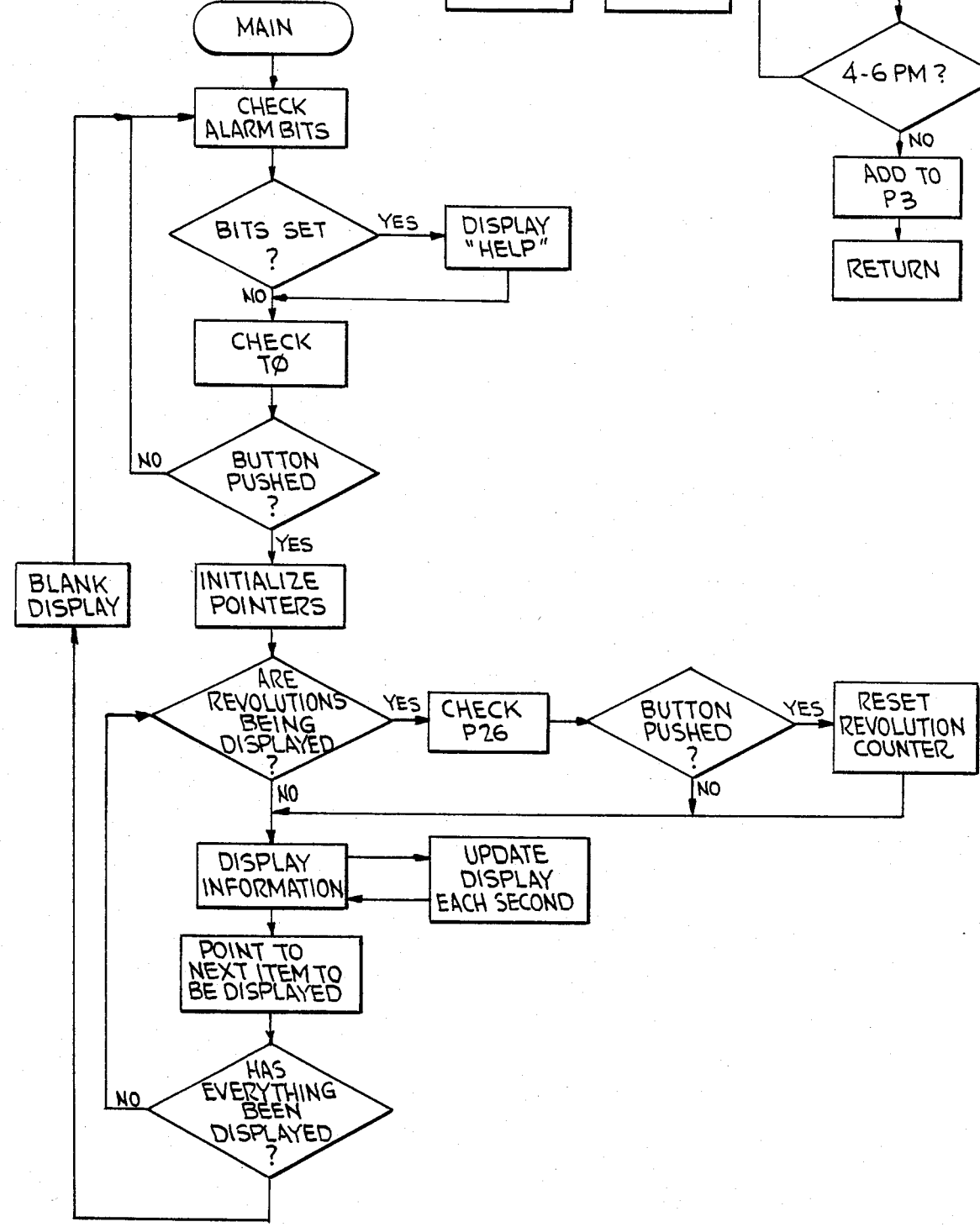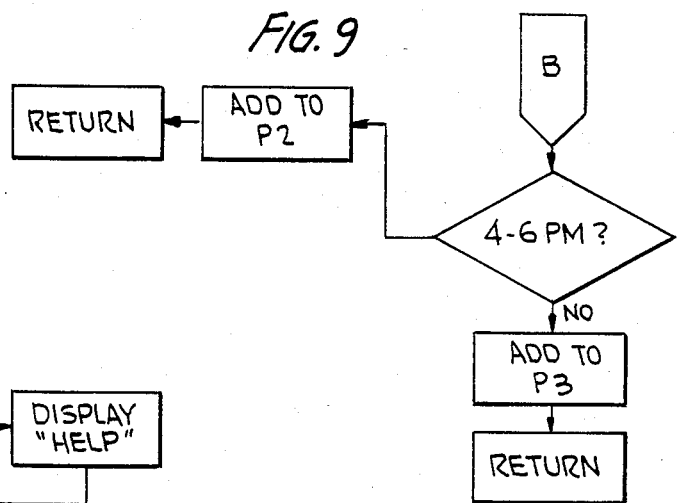

MULTIPLE RATE METERING SYSTEM

BACKGROUND OF THE INVENTION

1. Field of the Invention

This invention relates to a multiple rate metering system applicable to domestic customers.

2. Description of the Prior Art

It is a well known problem that electricity demand varies considerably during the course of the day with peaks in demand occurring at certain times of day. Utility companies must have the generating capacity to meet the demand in those peak periods. This requires a substantial capital investment in generating equipment, which most of the time is under-utilized. If the utility's customers can be persuaded to change their habits so as to ensure a more uniform consumption of electricity during the course of the day, substantial savings can be achieved, in that the available generating equipment can be operated at near-full capacity for a greater proportion of the time. Some progress has been made in flattening the load curve in the industrial sector by charging preferential rates for off-peak usage. However, little progress has been made in the private sector, largely as a result of the practical problem of converting very large numbers of small consumers over to multiple rate metering, even though the private sector collectively accounts for a major portion of electricity consumption.

SUMMARY OF THE INVENTION

An object of the present invention is to provide a multiple rate electricity metering system which can conveniently be employed with existing electricity meters.

According to the present invention there is provided a multiple rate metering system suitable for use with an existing single rate, electromechanical electricity meter employing an Eddy current disc mounted in a casing, comprising: a first unit mountable inside the casing of the electricity meter; and a second unit, which is portable so that it can be brought into close proximity with said first unit by a meter reader; said first unit comprising a sensor for generating pulses in response to rotation of the Eddy current disc, a first microprocessor, a first read-only-memory for storing a program to control the operation of said first microprocessor, a random-access-memory, said first microprocessor being programmed to store data in said random-access memory related to the pulses generated in different predetermined periods during which different electricity rates apply, and first coupling means for establishing communication through the casing with said second unit when said second unit is brought into proximity with said first unit; said second unit comprising second coupling means co-operating with said first coupling means to transmit and receive data to and from said first unit, a second microprocessor, a second read-only-memory for storing a program controlling the operation of said second microprocessor, a storage medium for storing data from said second microprocessor, display means, first actuator means operable by the reader to transmit a signal through said first and second coupling means to instruct said first microprocessor to transfer data relating to the pulse count in said different predetermined periods to said second unit, said second microprocessor being arranged to display said data in said display means, and second actuator means operable by the reader to accept said data and instruct said second microprocessor to store said data in said storage medium with appropriate customer identification for subsequent retrieval at a central location.

Preferably, each coupling means comprises a light-emitting diode and a phototransistor. The LED of the second unit emits a signal under the control of the second microprocessor, which is received by the phototransistor of the second unit. In this way, instructions controlling the operation of the first microprocessor can be passed from the second unit to the first unit. Under control from the second unit, the first microprocessor transmits the data from the random-access-memory to the second unit, where it is diplayed in the display means. This gives the reader an opportunity to verify the total unit count with the reading on the electromechanical read-out of the existing meter. The sum of the counts for the different predetermined periods should obviously be equal to count for the total period shown on the electromechanical read-out. The predetermined periods can, for example, represent different times of day. For example, the meter may record the pulse count for the period 9.00 a.m. to 12.00 noon separately from the pulse count for the remaining part of the day over the meter-reading period in question. The count stored in the RAM (random access memory) for each predetermined period will not normally be reset by the meter reader, that is the RAM will act as an accumulator in the same manner as the existing electromechanical read-out, and the pulse count representing the electricity consumed during the meter-reading period will be calculated by subtracting the current total from the previous total. This allows any errors to be corrected subsequently.

The microprocessor keeps track of the time of day, and the meter reader preferably has a facility in the second unit to reset the time registered by the microprocessor when the meter is read.

BRIEF DESCRIPTION OF THE DRAWINGS

The invention will now be described in more detail, by way of example only, with reference to the accompanying drawings, in which:

FIG. 3 is a memory map chart for the data memory employed in the present invention;

FIG. 4 is a flow chart for the initialization software routine performed by the microprocessor utilized in the present invention;

FIG. 5 is a flow chart of the setting software routine performed by the microprocessor employed in the present invention;

FIG. 6 and FIG. 7 are flow charts of the clock software routine performed by the microprocessor employed in the present invention;

FIGS. 8 and 9 are flow charts of the revolution counter software routine performed by the microprocessor employed as part of the present invention; and FIG. 10 is a flow chart of the main software program performed by the microprocessor as part of the present invention.

DESCRIPTION OF PREFERRED EMBODIMENT

Figure 1:
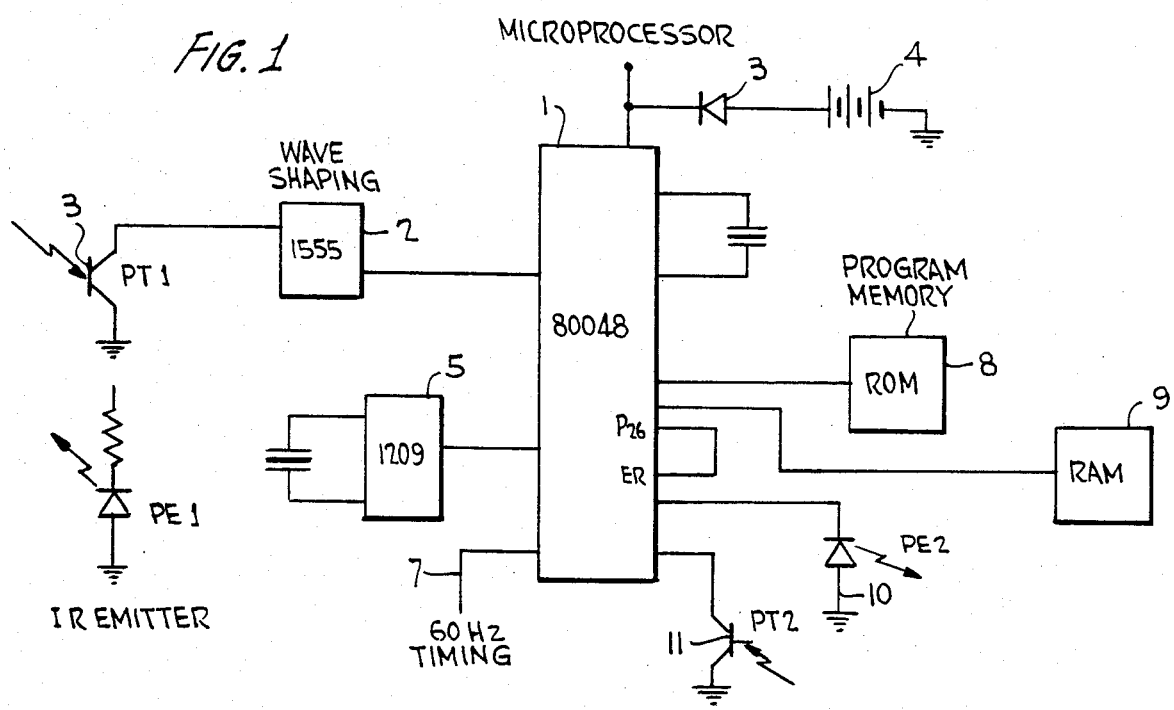
FIG. 1 is a block diagram of a first unit intended to be fitted into an existing electricity meter.

The first unit shown in FIG. 1 comprises an 80C48 microprocessor 1 connected through a CMOS integrated-circuit, wave-shaping unit 2 to the collector of a phototransistor 3 having its emitter connected to ground. The microprocessor 1 is connected through a diode 3 to a power supply 4, and synchronized to the standard 60 Hz supply by means of line 7. In the event of a power failure, unit 5, which is an ICM7029 crystal oscillator connected to a quartz crystal 6, takes over the clocking of the microprocessor 1.

A read-only-memory 8 and a random-access memory 9 are also connected to the microprocessor 1. The read-only-memory 8 stores a program controlling the operation of the microprocessor 1 which, in turn, stores data in the random-access memory 9. A light-emitting diode 10 and phototransistor 11 are also connected to the microprocessor 1.

The first unit is mounted inside the casing of an existing electricity meter. Such a meter has an Eddy current disc whose rate of rotation is determined by the power consumption of the customer. A black band broken at one point to provide a silver reflection is arranged on the disc. This black band is illuminated, and the phototransistor is arranged over it so as to be responsive to the passage of the silver reflection on each rotation of the disc. This generates a pulse which is shaped in the unit 2 before being passed to the microprocessor 1.

The microprocessor 1 is clocked in synchronism with the 60 Hz supply by the line 7, and maintains a clock for the time of day and a calendar for the date. Under program control from the read-only-memory 8, the microprocessor 1 accumulates the pulse count from the phototransistor 3 during different predetermined periods. Any number of such periods can be provided. For example, the microprocessor 1 can be instructed to accumulate the count in the period 7.00 to 11.00 a.m. on weekdays in one section of the memory, in the period 4.00 p.m. to 6.00 p.m. on weekdays in another section of the memory, in the remaining weekday hours in another section of the memory, and the count at weekends in another section of the memory, giving four predetermined periods in total. Since the microprocessor 1 maintains a calendar in the random-access memory 9, the system can also be programmed to take into account statutory holidays and place the count for these days in the weekend section of the memory. Alternatively, of course, the microprocessor 1 can be instructed to accumulate the counts for different periods, for example, the 7.00 to 11.00 a.m. periods and the 4.00 to 6.00 p.m. periods in the same section of the memory if electricity during these periods is to be billed on the same tariff.

Figure 2:
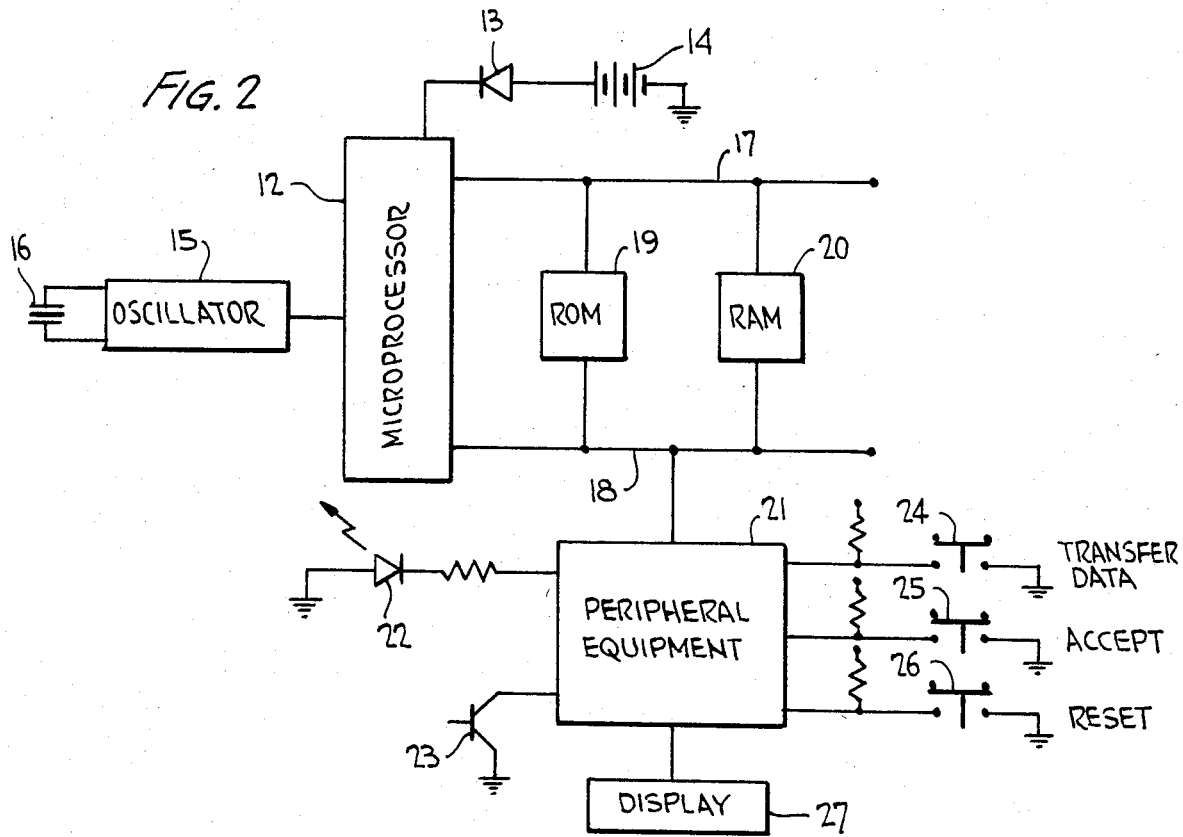
FIG. 2 is a block diagram of a second unit intended to be carried by a meter reader.

The second unit, shown in FIG. 2, is mounted in a portable casing and comprises a microprocessor 12 connected through a diode 13 to a power supply 14. An oscillator 15 connected to a quartz crystal 16 provides clock pulses to drive the microprocessor 12, which is also connected through an address bus 17 and a data bus 18 to a read-only-memory 19 and a random-acces memory 20. The read-only-memory stores a program controlling the operation of the microprocessor 12. The data bus is connected the peripheral equipment 21. A light-emitting diode 22 and a phototransistor 23 are connected to the peripheral equipment 21. This is connected to three control buttons 24, 25, 26, and a LED display 27.

When the meter reader makes his rounds, he carries with him the portable unit shown in FIG. 2. At each customer's premises, he places the unit next to the existing electricity meter, in which has previously been installed the first unit, with the light-emitting diode 22 and phototransistor 23 of the second unit disposed respectively opposite the light-emitting diode 10 and the phototransistor 11 of the first unit. In this manner data can be transferred serially in binary form between the two units in both directions without, creating stray magnetic fields which might influence the operation of the electromechanical meter.

By pressing the button 24, the meter reader causes the microprocessor in the second unit to send a signal through the optical coupling to the microprocessor in the first unit instructing it to transfer the data in the first RAM 9 to the second unit. Here, under the control of the operator, it is displayed in the display unit 27 enabling the operator to verify it to be correct. For example, the operator can total the number of units consumed in each of the predetermined periods over the meter-reading period and verify that this total agrees with the number of units consumed as shown by the existing electromechanical register. If the two agree, the operator can accept the data by pressing the accept button 25, causing it to be stored in the RAM 20 of the second unit. A customer identification signal is stored in the first unit and transferred into the second unit along with the data, so the RAM 20 of the second unit stores the customer identification, and the total count number in each of the predetermined periods. The meter reader then passes to the next customer and repeats the process, so that at the end of the day data are stored in the RAM 20 relating to the total count number for each customer visited during the day in each predetermined time period, along with appropriate customer identification.

On his return to the utility's office, the meter reader connects the second unit directly to the main-frame computer and transfers the data contained in the RAM 20 into the central memory. From this data, the central computer is able to prepare the customer's monthly bill, showing the number of units consumed in each of the predetermined time periods.

The second unit is shown as having a RAM 20 as the storage medium for the data because static RAM's are now available of sufficient capacity and low power consumption to hold one day's worth of data. The RAM 20 can, of course, be replaced by any other suitable storage medium, such as a cassette tape. This does have the problem in cold climates that the tape tends to become brittle leading to loss of data. For this reason, the static RAM is preferred.

The meter reader does not normally reset the count in the sections of the RAM 9 of the first unit relating to the various predetermined time periods. This enables subsequent verification if a customer queries a bill, in the same way as the total count on the register of an existing meter can always be referred to in the event of a query. By means of the reset button 26, however, he is able to reset the clock and calendar being maintained by the microprocessor 1 in the event that they are incorrect.

Although the first unit normally takes its power from the mains supply, a back-up battery is provided, which takes over in the event of a power failure, at which time the oscillator also takes over the clocking of the first microprocessor 1.

The ROM in the first unit can be pre-programmed according to the utility's individual requirements. Different ROMs can be manufactured containing different standard programs, or, alternatively, the first unit can be provided with a PROM (programmable read-only-memory) to enable a customized program to be burnt in.

If the meter reader finds he is not able to accept the data displayed in the display unit, he can make a correction by making use of the optical coupling between the two units.

The data memory map illustrated in FIG. 4 and the flow charts for the various microprocessor software routines illustrated in FIGS. 5–10 are employed in conjunction with microprocessor 1 in FIG. 1. These flow charts are self-explanatory and require no additional explanation.

I claim:

1. A multiple rate metering system suitable for use with an existing single rate, electromechanical electricity meter employing an Eddy current disc mounted in a casing, comprising: a first retrofit unit mountable inside the casing of the electricity meter;

and a second unit, which is portable so that it can be brought into close proximity with said first unit by a meter reader;

said first unit comprising a sensor for generating pulses in response to rotation of the Eddy current disc, a first microprocessor, a first read-only-memory for storing a program to control the operation of said first microprocessor, a random-access-memory, said first microprocessor being programmed to store data in said random-access-memory related to the pulses generated in different predetermined periods during which different electricity rates apply, and first coupling means for establishing non-contact communication through the casing with said second unit when said second unit is brought into close proximity with said first unit;

said second unit comprising second coupling means cooperating with said first coupling means to transmit and receive data to and from said first unit, a second microprocessor, a second read-only-memory for storing a program controlling the operation of said second microprocessor, a storage medium for storing data from said second microprocessor, display means, first actuator means operable by the meter reader to transmit a signal through said first and second coupling means to instruct said first microprocessor to transfer data relating to the pulses generated in said different predetermined periods to said second unit, said second microprocessor being programmed to display said data in said display means, and second actuator means operable by the meter reader to accept said data and instruct said second microprocessor to store said data in said storage medium with appropriate customer identification for subsequent retrieval at a central location.

2. A multiple rate metering system according to claim 1 wherein said storage medium in said second unit is also an random-access memory.

3. A multiple rate metering system according to claim 1 wherein said first and second coupling means each comprise optical couplings.

4. A multiple rate metering system according to claim 3 wherein said each optical coupling comprises a light-emitting diode and a phototransistor, whereby when data is transferred between said first and second couplings, the phototransistor of the first coupling means is placed opposite the light-emitting diode of the second coupling means, and the phototransistor of the second coupling means is placed opposite the light-emitting diode of the first coupling means such that data is transferred serially between said two units in the form of optical pulses under the control of said microprocessors.

5. A multiple rate metering system according to claim 1 wherein said sensor comprises a phototransistor responsive to the passage of a mark on the Eddy current disc of the electromechanical meter.

6. A multiple rate metering system according to claim 5 wherein said sensor is connected to said first microprocessor through a CMOS wave-shaping circuit.

7. A multiple rate metering system according to claim 1 comprising means for deriving clock pulses for said first microprocessor from the mains supply, said first microprocessor being clocked in synchronism with the mains supply.

8. A multiple rate metering system according to claim 7 further comprising an oscillator for providing clock pulses to the first microprocessor in the event of a power failure or reduction in mains frequency.

9. A multiple rate metering system according to claim 1 wherein said storage medium is magnetic tape.

10. A multiple rate metering system according to claim 1 wherein said second unit comprises means enabling the meter reader to reset the microprocessor of the first unit.

11. A multiple rate metering system according to 1 wherein said second unit is also provided with coupling means for connection to a central computer to enable the data stored in said storage medium to be transferred to the main memory of said central computer.

* * * * *